(12) United States Patent
Lee

(10) Patent No.: US 11,226,895 B2
(45) Date of Patent: Jan. 18, 2022

(54) CONTROLLER AND OPERATION METHOD THEREOF

(71) Applicant: SK hynix Inc., Gyeonggi-do (KR)

(72) Inventor: Joo-Young Lee, Seoul (KR)

(73) Assignee: SK hynix Inc., Icheon-si (KR)

( * ) Notice: Subject to any disclaimer, the term of this patent is extended or adjusted under 35 U.S.C. 154(b) by 0 days.

(21) Appl. No.: 16/799,107

(22) Filed: Feb. 24, 2020

(65) Prior Publication Data

US 2021/0011842 A1    Jan. 14, 2021

(30) Foreign Application Priority Data

Jul. 8, 2019    (KR) ........................ 10-2019-0082027

(51) Int. Cl.
| | |
|---|---|
| *G06F 12/02* | (2006.01) |
| *G06F 12/06* | (2006.01) |
| *G06F 9/38* | (2018.01) |
| *G06F 9/50* | (2006.01) |
| *G06F 13/16* | (2006.01) |
| *G11C 11/56* | (2006.01) |
| *G06F 9/48* | (2006.01) |

(52) U.S. Cl.
CPC ........ *G06F 12/0246* (2013.01); *G06F 9/3851* (2013.01); *G06F 9/4881* (2013.01); *G06F 9/5016* (2013.01); *G06F 12/0607* (2013.01); *G06F 13/1668* (2013.01); *G11C 11/5628* (2013.01); *G06F 2212/7201* (2013.01); *G11C 2211/5641* (2013.01)

(58) Field of Classification Search
CPC ............. G06F 12/0246; G06F 12/0607; G06F 9/3851; G06F 9/5016; G06F 13/1668; G06F 9/4881; G06F 2212/7201; G11C 11/5628; G11C 2211/5641; G11C 16/0483; G11C 16/10
USPC ........................................................ 711/154
See application file for complete search history.

(56) References Cited

U.S. PATENT DOCUMENTS

| | | | | |
|---|---|---|---|---|
| 2018/0053555 | A1* | 2/2018 | Wong | G11C 16/3454 |
| 2018/0113650 | A1* | 4/2018 | Byun | G06F 3/061 |

FOREIGN PATENT DOCUMENTS

| | | |
|---|---|---|
| KR | 100878479 B1 | 1/2009 |
| KR | 10-2017-0113013 A | 10/2017 |
| KR | 10-2018-0102241 A | 9/2018 |

* cited by examiner

*Primary Examiner* — Fernando Hidalgo
(74) *Attorney, Agent, or Firm* — Perkins Coie LLP

(57) ABSTRACT

A controller configured to control memory chips in communication with the controller is provided. The controller comprises: a host interface configured to receive a request from a host; an address mapper configured to, upon receipt of both a turbo write request for writing data to one or more high-speed storage blocks at a high speed to and a normal write request for writing data to one or more storage blocks at a lower speed, allocate a first plane including a memory block configured to perform write operations in a single level cell mode at the high speed to a first plane group in order to respond to the turbo write request, and allocate a second plane to a second plane group at the slower speed in order to respond to the normal write request; and a memory interface configured to control the memory chips.

18 Claims, 8 Drawing Sheets

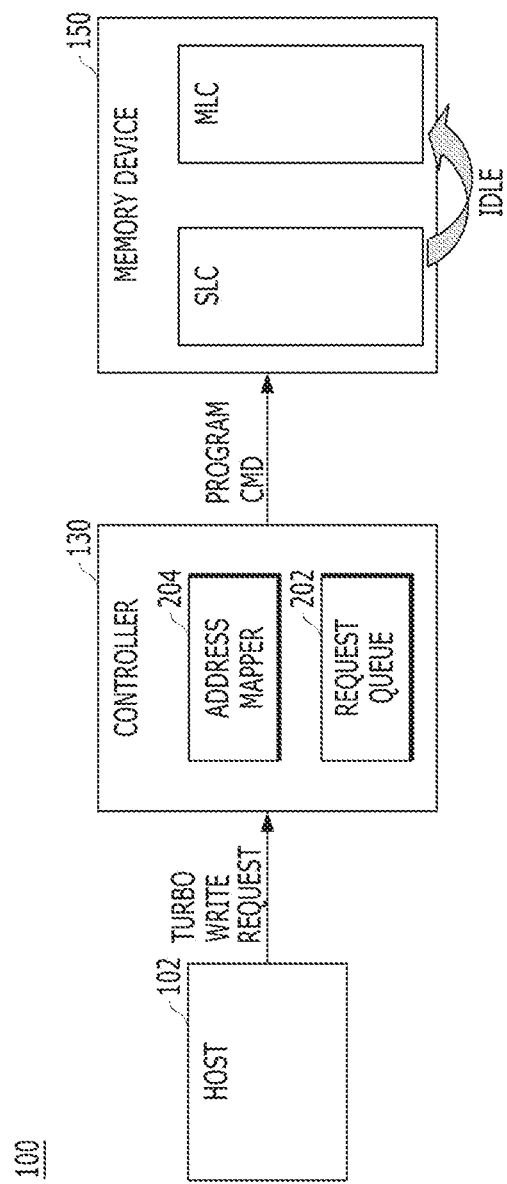

CONTROLLER AND OPERATION METHOD THEREOF

CROSS-REFERENCE TO RELATED APPLICATION

This application claims the priority and benefits of Korean Patent Application No. 10-2019-0082027 filed on Jul. 8, 2019, which is incorporated herein by reference in its entirety.

TECHNICAL FIELD

The embodiments of the disclosed technology generally relate to a controller that controls the operations of a memory device.

BACKGROUND

The computer environment paradigm has shifted to cloud computing and is progressing toward ubiquitous computing, which enables computing systems to be used anytime and anywhere. The use of portable electronic devices such as mobile phones, digital cameras, and laptop computers has rapidly increased. These portable electronic devices generally use memory systems having one or more memory devices for storing data. Such memory systems may be used as a main memory device or an auxiliary memory device of a portable electronic device.

Memory systems using semiconductor memory devices provide advantages such as excellent stability and durability, high information access speed, and low power consumption. Examples of memory systems having such advantages include universal serial bus (USB) memory devices, memory cards having various interfaces, and solid state drives (SSD).

SUMMARY

The embodiments of this patent document relate to a controller that can execute mixed requests of turbo write and normal write.

In an embodiment, there is provided a controller configured to control memory chips in communication with the controller, each of the memory chips including at least one plane, each plane including a plurality of memory blocks. The controller comprises: a host interface configured to receive a request from a host; an address mapper configured to, upon receipt of both a turbo write request for writing data to one or more high-speed storage blocks at a high speed to and a normal write request for writing data to one or more storage blocks at a lower speed, allocate, among the at least one plane of each of the memory chips, a first plane including a memory block configured to perform write operations in a single level cell mode at the high speed to a first plane group in order to respond to the turbo write request, and allocate a second plane to a second plane group at the slower speed in order to respond to the normal write request; and a memory interface configured to control the memory chips such that the first plane group performs an operation corresponding to the turbo write request and the second plane group performs an operation corresponding to the normal write request.

In accordance with an embodiment, there is provided an operation method of a controller configured to control a plurality of memory chips in communication with the controller, each of the memory chips including at least one plane, each plane including a plurality of memory blocks. The operation method comprises: receiving a request from a host; upon receipt of both a turbo write request and a normal write request, allocating, among the at least one plane of each of the memory chips, a first plane including a memory block configured to perform write operations in a single level cell mode to a first plane group, and allocating a second plane to a second plane group, the first plane being different from the second plane; and controlling the memory chips such that the first plane group performs an operation corresponding to the turbo write request and the second plane group performs an operation corresponding to the normal write request.

In accordance with the embodiment, even though the turbo write request and the normal write request are received in a mixed manner, it is possible to provide a controller capable of guaranteeing the performance of the turbo write request, and an operation method thereof.

BRIEF DESCRIPTION OF THE DRAWINGS

FIG. 5 is a diagram for explaining a turbo write operation of a memory system.

DETAILED DESCRIPTION

The technology disclosed in this patent document can be implemented in some embodiments to provide electronic systems and methods that, among other features and benefits, support turbo write operations. Hereinafter, embodiments will be described in more detail with reference to the drawings.

Figure 1:
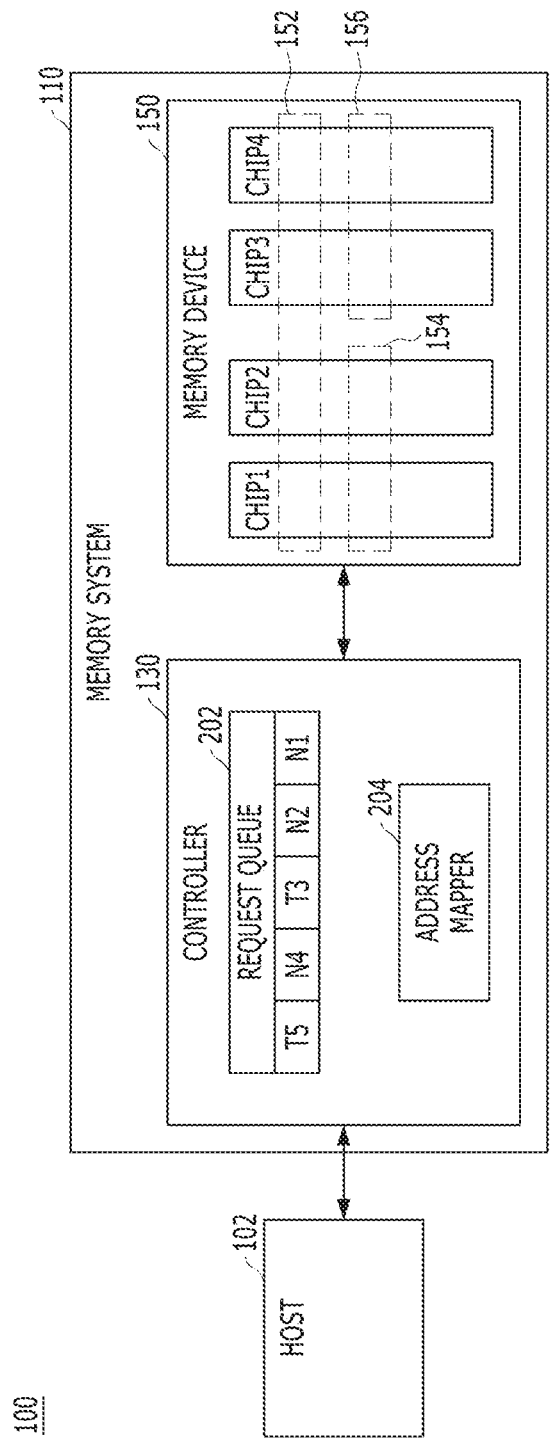
FIG. 1 is a diagram schematically illustrating an example of a data processing system including a memory system based on an embodiment of the disclosed technology.

FIG. 1 is a block diagram illustrating a data processing system 100 based on an embodiment of the present invention.

Referring to FIG. 1, the data processing system 100 may include a memory system 110 and a host 102.

Examples of the host 102 may include various portable electronic devices such as mobile phones, MP3 players and laptop computers, or various non-portable electronic devices such as desktop computers, game machines, television (TV), and projectors.

The host 102 may include software such as operating system (OS) to manage and control overall functions and operations of the host 102, and execute requests from a user using the data processing system 100 or the memory system 110. The OS may support functions and operations requested by a user. For example, the OS may be divided into a general OS and a mobile OS, depending on the mobility of the host 102. The general OS may be divided into a personal OS and an enterprise OS, depending on the environment of a user.

The memory system 110 may operate to store data for the host 102 in response to a request of the host 102. Non-limiting examples of the memory system 110 may include a solid state drive (SSD), a multi-media card (MMC), a secure digital (SD) card, a universal storage bus (USB) device, a universal flash storage (UFS) device, compact flash (CF) card, a smart media card (SMC), a personal computer memory card international association (PCMCIA) card and memory stick. The MMC may include an embedded MMC (eMMC), reduced size MMC (RS-MMC) and micro-MMC, and the. The SD card may include a mini-SD card and micro-SD card.

The memory system 110 may be embodied by various types of storage devices. Examples of such storage devices may include, but are not limited to, volatile memory devices such as a dynamic random access memory (DRAM) and a static RAM (SRAM) and nonvolatile memory devices such as a read only memory (ROM), a mask ROM (MROM), a programmable ROM (PROM), an erasable programmable ROM (EPROM), an electrically erasable programmable ROM (EEPROM), a ferroelectric RAM (FRAM), a phase-change RAM (PRAM), a magneto-resistive RAM (MRAM), resistive RAM (RRAM or ReRAM) and a flash memory. The flash memory may have a 3-dimensional (3D) stack structure.

The memory system 110 may include a controller 130 and a memory device 150. The memory device 150 may store data for the host 102, and the controller 130 may control data storage into the memory device 150.

The controller 130 and the memory device 150 may be integrated into a single semiconductor device. For example, the controller 130 and the memory device 150 may be integrated as one semiconductor device to constitute a solid state drive (SSD). When the memory system 110 is used as an SSD, the operating speed of the host 102 connected to the memory system 110 can be improved. In addition, the controller 130 and the memory device 150 may be integrated as one semiconductor device to constitute a memory card. For example, the controller 130 and the memory device 150 may constitute a memory card such as a personal computer memory card international association (PCMCIA) card, compact flash (CF) card, smart media (SM) card, memory stick, multimedia card (MMC) including reduced size MMC (RS-MMC) and micro-MMC, secure digital (SD) card including mini-SD card, micro-SD card and SDHC card, or universal flash storage (UFS) device.

Non-limiting application examples of the memory system 110 may include a computer, an Ultra Mobile PC (UMPC), a workstation, a net-book, a Personal Digital Assistant (PDA), a portable computer, a web tablet, a tablet computer, a wireless phone, a mobile phone, a smart phone, an e-book, a Portable Multimedia Player (PMP), a portable game machine, a navigation system, a black box, a digital camera, a Digital Multimedia Broadcasting (DMB) player, a 3-dimensional television, a smart television, a digital audio recorder, a digital audio player, a digital picture recorder, a digital picture player, a digital video recorder, a digital video player, a storage device constituting a data center, a device capable of transmitting/receiving information in a wireless environment, one of various electronic devices constituting a home network, one of various electronic devices constituting a computer network, one of various electronic devices constituting a telematics network, a Radio Frequency Identification (RFID) device, or one of various components constituting a computing system.

The memory device 150 may be a nonvolatile memory device and may retain data stored therein even though power is not supplied. The memory device 150 may store data provided from the host 102 through a write operation, and provide data stored therein to the host 102 through a read operation.

The memory device 150 may include a flash memory device. The flash memory device may store data in a memory cell array including memory cell transistors. The flash memory device may have a hierarchical structure of memory die, plane, memory block and page. One memory die may receive one command at a time. The flash memory device may include a plurality of memory dies. One memory die may include a plurality of planes, and the plurality of planes may process commands received by the memory die in parallel. Each of the planes may include a plurality of memory blocks. The memory block may correspond to the minimum unit of an erase operation. One memory block may include a plurality of pages. The page may correspond to the minimum unit of a write operation.

FIG. 1 illustrates a memory device 150 including, e.g., four memory chips CHIP1 to CHIP4.

The memory device 150 may include a single level cell (SLC) memory block configured to store one bit of data in one memory cell and a multi-level cell (MLC) memory block configured to store two or more bits of data in one memory cell. For example, the MLC memory block may include a triple level cell (TLC) memory block configured to store three bits of information per cell and a quadruple level cell (QLC) memory block configured to store four bits of information per cell. The MLC memory block may store more data per unit area than the SLC memory block. On the other hand, the MLC memory block requires more sophisticated program and read operations than the SLC memory block, resulting in a long access time. For example, in writing more than one data bit in a memory cell, fine placement of the threshold voltage levels of memory cells is needed because of the reduced distance between adjacent distributions. This is achieved by using incremental step pulse program (ISPP), i.e., memory cells on the same word-line are repeatedly programmed using a program-and-verify approach with a stair case program voltage applied to word-lines. Each programmed state associates with a verify voltage that is used in verify operations and sets the target position of each threshold voltage distribution window. For this reason, the time it takes to complete write and read operations on the MLC memory block is longer than that of the SLC memory block.

A memory system 110 may support turbo write such that the memory device 150 including the MLC memory block provides high access performance to a user. In some implementations, a memory system 110 can employ a turbo write scheme to increase the write speed of MLC memory blocks by using internal SLC buffering space, which is separated from the "normal" MLC memory space with MLC memory blocks to improve performance. In writing data, the system 110 first writes to the SLC buffering space at a high speed and subsequently transfers the written data in the SLC buffering space to the MLC memory space at a lower speed than the high speed during the idle time, thus freeing up the SLC buffering space for additional turbo write. In one example, upon receipt of a turbo write request from a host 102, a controller 130 may write data received from the host 102 into the SLC memory block of the memory device 150, and then write that data from the SLC memory block into the MLC memory block during an idle time of the memory device 150. In this way, the turbo write scheme enables the memory system 110 to improve performance while storing a large amount of data in the MLC memory block.

The memory chips may operate in parallel. The controller 130 may individually provide a command to the memory chips in an interleaving manner. Each memory chip of the memory device 150 may simultaneously perform operations such as read, program or erase in response to the command. In some implementations, the memory system 110 may combine consecutive logical blocks into a superblock to exploit spatial and temporal locality. In one example, the controller 130 may configure a superblock by logically grouping memory blocks into which data may be programmed in parallel. As shown in FIG. 1, a first superblock 152 includes memory blocks of the first to fourth memory chips CHIP1 to CHIP4.

The controller 130 may include a memory for request queue 202 and an address mapper 204. The request queue 202 may sequentially queue requests received by the controller 130. The requests may include a logical address as part of the requests. As shown in FIG. 1, a first normal write request N1, a second normal write request N2, a third turbo write request T3, a fourth normal write request N4, and a fifth turbo write request T5 are sequentially queued in the request queue 202.

The address mapper 204 may map the logical address, which corresponds to the request queued in the request queue 202, to a physical address of the memory device 150. For example, the address mapper 204 may individually map logical addresses corresponding to write requests to physical addresses of the first to fourth memory chips CHIP1 to CHIP4 such that the write data received with the write requests is written into the first superblock 152 in an interleaving manner.

The address mapper 204 may convert the logical addresses associated with the requests into physical addresses in the order in which the write requests are queued in the memory for request queue 202, and schedule the execution of commands based on the physical addresses converted from the logical addresses. For example, the address mapper 204 may schedule the execution of program commands corresponding to the first and second normal write requests N1 and N2 and then schedule the execution of a program command corresponding to the third turbo write request T3.

In some implementations, the memory system 110 includes a plurality of memory dies such as the memory device 150. Each die includes one or more planes such that identical, concurrent operations can take place on each plane. Each plane includes a number of blocks, which are the smallest unit that can be erased. Each block includes a number of pages, which are the smallest unit that can be programmed or read. When the controller 130 configures a superblock by allocating memory blocks one by one from all planes of the memory device 150, the controller 130 may provide all the planes with the program commands corresponding to the first and second normal write request N1 and N2 and the third turbo write request T3. Since one plane may perform only one type of operation at a time, the memory device 150 may perform a program operation corresponding to the third turbo write request T3 after the execution of the first and second normal write requests N1 and N2 are completed.

The host 102 may provide a turbo write request to the controller 130 in anticipation of high write performance. Therefore, if the execution of the turbo write request needs to be delayed until a normal write request that with low performance needs to be first completed before the turbo write request is performed, it may be difficult for the memory system 110 to provide write performance that a user expects.

When the normal write request and the turbo write request are mixed, it may be possible to consider a method in which the controller 130 controls the memory device 150 to program data in an SLC mode with respect to all write requests in order to provide high write performance. However, when the data is programmed in the SLC mode with respect to all the write requests, the memory spaces of the memory device 150 may be wasted and the life of the memory blocks may be quickly reduced.

Based on the embodiment, when the turbo write request is received, the controller 130 may queue the turbo write request to the request queue 202 and schedule the execution of a program command such that the turbo write request and the normal write request are performed in different planes. FIG. 1 illustrates a second superblock 154 composed of the memory blocks of the first and second memory chips CHIP1 and CHIP2 and a third superblock 156 composed of the memory blocks of the third and fourth memory chips CHIP3 and CHIP4. Based on an implementation, the first superblock 152 and the third superblock 156 may be configured as the MLC memory blocks and the second superblock 154 may be configured as the SLC memory block.

In a case where both the turbo write request and the normal write request need to be performed, the address mapper 204 may allocate the second superblock 154 in order to perform a program operation corresponding to the turbo write request and allocate the third superblock 156 in order to perform a program operation corresponding to the normal write request. The case where both the turbo write request and the normal write request need to be performed may include a case where both the turbo write request and the normal write request have been queued in the request queue 202.

When the turbo write request has not been queued in the request queue 202, the address mapper 204 may allocate the first superblock 152 in order to perform the program operation corresponding to the normal write request.

In the example of FIG. 1, the program operation corresponding to the turbo write request may be performed in the planes included in the first and second memory chips CHIP1 and CHIP2. Furthermore, when the turbo write request is queued in the request queue 202, the program operation corresponding to the normal write request may be performed in the planes included in the third and fourth memory chips CHIP3 and CHIP4.

Based on the embodiment, when the normal write request and the turbo write request are received in a mixed manner, the memory device 150 may process the two requests in parallel, thereby substantially preventing the performance of the turbo write request from being degraded by the normal write request. When the turbo write request is queued in the request queue 202, the address mapper 204 may schedule the execution of a program command such that the program operation corresponding to the turbo write request is performed without waiting for the completion of a normal write request queued before the turbo write request.

Figure 2:
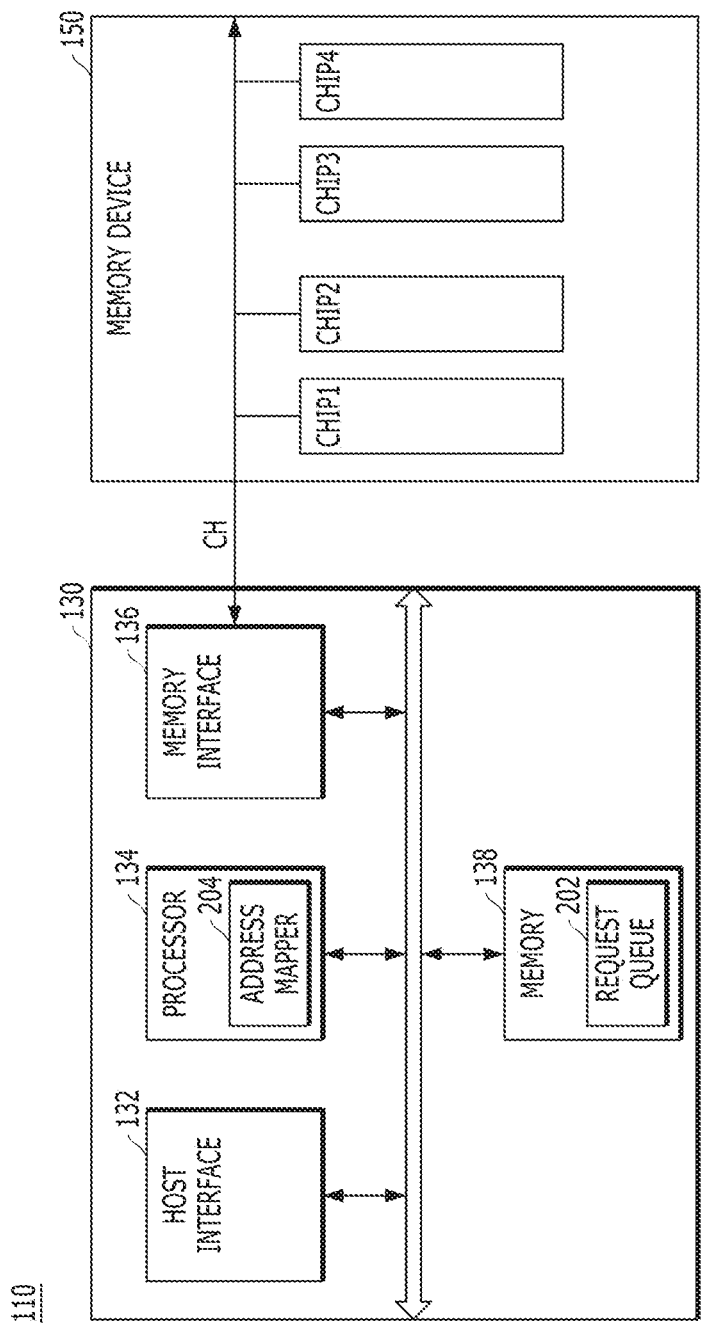
FIG. 2 is a diagram illustrating an example of a memory system based on an embodiment of the disclosed technology.

FIG. 2 is a diagram illustrating an example of a memory system 110 including a controller 130 and the memory device 150 based on the embodiment. The controller 130 and the memory device 150 of the memory system 110 of FIG. 2 correspond to the controller 130 and the memory device 150 described with reference to FIG. 1.

The controller 130 may include a host interface (I/F) 132, a processor 134, a memory I/F 136, and a memory 138 all operatively coupled via an internal bus.

The host I/F 132 may be configured to process a command and data of the host 102, and may communicate with the host 102 through one or more of various interface protocols such as universal serial bus (USB), multi-media card (MMC), peripheral component interconnect-express (PCI-e or PCIe), small computer system interface (SCSI), serial-attached SCSI (SAS), serial advanced technology attachment (SATA), parallel advanced technology attachment (PATA), enhanced small disk interface (ESDI) and integrated drive electronics (IDE).

The host I/F 132 may be driven through firmware referred to as a host interface layer (HIL) in order to exchange data with the host.

The host interface 132 may receive a request from the host 102 and analyze the request of the host 102. For example, the host interface 132 may analyze whether the request of the host is a read request or a write request. When the request of the host is the write request, the host interface 132 may analyze whether the write request is a normal write request or a turbo write request. The host interface 132 may queue the analyzed request in the request queue 202.

The processor 134 may control the overall operations of the memory system 110. The processor 134 may perform firmware operations to control the overall operations of the memory system 110. The firmware may be referred to as flash translation layer (FTL). Also, the processor 134 may be realized as a microprocessor or a central processing unit (CPU). In some implementations, the FTL controls how data is stored and retrieved to and from the memory system 110. Hard disk drives have been key storage devices, and thus file systems for hard disk drives are being used as general-purpose file systems. Memory systems having flash memory devices can utilize such general-purpose file systems, but they are suboptimal for several reasons, such as erasing blocks and wear leveling. For example, flash memory blocks need to be erased before they can be written to, and thus the memory systems having flash memory devices need to have information associated with erasing blocks, which hard disk drives do not need. Therefore, the FTL is used between the general-purpose file system and the flash memory.

For example, the controller 130 may perform an operation requested by the host 102 through the processor 134, which is realized as a microprocessor or a CPU. In other words, the controller 130 may perform a command operation corresponding to a command received from the host 102. The controller 130 may perform a foreground operation as the command operation corresponding to the command received from the host 102. For example, the request received from the host 102 may include the read request and the write request. The write request may be one of the normal write request and the turbo write request.

The processor 134 may include the address mapper 204. The address mapper 204 may convert a request including a logical address into a command including a physical address. The address mapper 204 may allocate a physical address to the command with reference to a mapping table (not illustrated) stored in the controller 130. The address mapper 204 may update mapping information between the logical address and the physical address in the mapping table.

The address mapper 204 may schedule the execution of a plurality of commands corresponding to requests such that the memory device 150 operates in an interleaving manner. For example, in order for operations corresponding to the plurality of commands to be performed in a plurality of planes, the address mapper 204 may allocate physical addresses of the plurality of planes to the plurality of commands, respectively.

In an embodiment, the address mapper 204 may allocate a physical address of the SLC memory block to the program command corresponding to the turbo write request, and control the memory device 150 to program data in the SLC mode. In an embodiment, the address mapper 204 may allocate a physical address of the MLC memory block to the program command corresponding to the turbo write request, and control the memory device 150 to program data in the SLC mode in response to the program command.

In accordance with an implementation, the address mapper 204 may be included in a flash translation layer and be operated by the processor 134

The controller 130 may perform a background operation onto the memory device 150 through the processor 134, which is realized as a microprocessor or a CPU. For example, the background operation performed onto the memory device 150 may include a garbage collection (GC) operation, a wear-leveling (WL) operation, a map flush operation, or a bad block management operation. Furthermore, the processor 134 may perform an operation of controlling the memory device 150 to program data, which is stored by the program command corresponding to the turbo write request, in the multi-level cell mode as a background operation.

The memory I/F 136 may serve as a memory/storage interface for interfacing the controller 130 and the memory device 150 such that the controller 130 controls the memory device 150 in response to a request from the host 102. When the memory device 150 is a flash memory or specifically a NAND flash memory the memory I/F 136 may generate a control signal for the memory device 150 and process data to be provided to the memory device 150 under the control of the processor 134. The memory I/F 136 may work as an interface (e.g., a NAND flash interface) for processing a command and data between the controller 130 and the memory device 150. Specifically, the memory I/F 136 may support data transfer between the controller 130 and the memory device 150.

The memory I/F 136 may be operated through firmware referred to as a flash interface layer (FIL) in order to exchange data with the memory device 150.

The memory 138 may serve as a working memory of the memory system 110 and the controller 130, and store data for driving the memory system 110 and the controller 130. The controller 130 may control the memory device 150 to perform read, program and erase operations in response to a request from the host 102. The controller 130 may provide data read from the memory device 150 to the host 102, may store data provided from the host 102 into the memory device 150. The memory 138 may store data required for the controller 130 and the memory device 150 to perform these operations. For example, the memory 138 may store the mapping table.

The memory 138 may include a buffer, a cache, a queue and the like in order to store data for performing operations such as write and read between the host 102 and the memory device 150. The memory 138 may include the request queue 202. The request queue 202 may queue a request received from the host 102. A normal write request and a turbo write request may be mixed in the request queue 202 according to a request provided from the host 102 to the controller 130.

The memory device 150 may be a nonvolatile memory device and may retain data stored therein even though power is not supplied. The memory device 150 may store data provided from the host 102 through a write operation, and provide data stored therein to the host 102 through a read operation. The memory device 150 may include a plurality of memory blocks 152, 154, 156 . . . each of which may include a plurality of pages, and each of the pages may include a plurality of memory cells coupled to a word line. In an embodiment, the memory device 150 may be a flash memory. The flash memory may have a 3-dimensional (3D) stack structure.

In accordance with an embodiment of the present invention, the memory device 150 is described as a non-volatile memory, such as a flash memory, e.g., a NAND flash memory. However, the memory device 150 may be realized as any of a Phase Change Random Access Memory (PCRAM), a Resistive Random Access Memory (RRAM or ReRAM), a Ferroelectric Random Access Memory (FRAM), a Spin Transfer Torque Magnetic Random Access Memory (STT-RAM or STT-MRAM). The memory device 150 may include a plurality of memory blocks including a multi-level cell memory block capable of storing two bits or more of data in one memory cell. A multi-level cell programmed in the multi-level cell mode may store two bits or more of data. A multi-level cell programmed in the single level cell mode may store one bit of data.

The memory device 150 may include a plurality of memory chips CHIP1 to CHIP4. In the example of FIG. 2, the plurality of memory chips CHIP1 to CHIP4 may be electrically connected to the controller 130 through one channel CH. The number of channels included in the memory device 150 and the number of memory chips electrically connected to each channel are not limited to the example of FIG. 2.

The controller 130 may provide only one command to one channel at the same time. However, the plurality of memory chips CHIP1 to CHIP4 having received the command may operate at the same time. In order to improve the performance of the memory device 150, the controller 130 may control the plurality of memory chips CHIP1 to CHIP4 to operate in parallel. For example, the address mapper 204 may individually map consecutive logical addresses corresponding to a write request to physical addresses of the plurality of memory chips CHIP1 to CHIP4. The address mapper 204 may provide program commands for the plurality of memory chips CHIP1 to CHIP4 through a channel.

Figure 3:
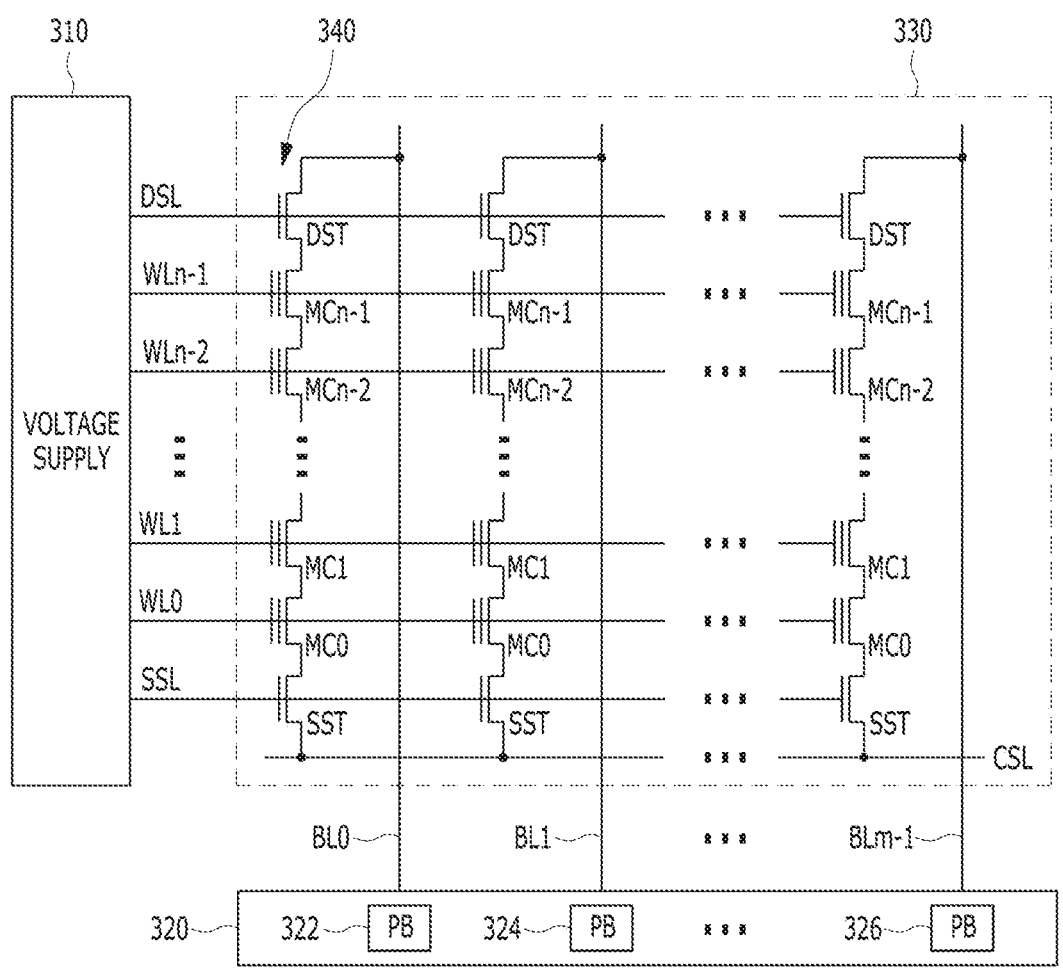
FIG. 3 is a diagram illustrating a memory cell array circuit included in a memory device.

FIG. 3 is a circuit diagram illustrating an exemplary configuration of a memory cell array of a memory block in the memory device 150.

Referring to FIG. 3, a memory block 330, which may correspond to any of the plurality of memory blocks 152 to 156 included in the memory device 150 of the memory system 110, may include a plurality of cell strings 340 coupled to a plurality of corresponding bit lines BL0 to BLm−1. The cell string 340 of each column may include one or more drain select transistors DST and one or more source select transistors SST. Between the drain and source select transistors DST and SST, a plurality of memory cells or memory cell transistors MC0 to MCn−1 may be coupled in series. In an embodiment, each of the memory cells MC0 to MCn−1 may be embodied by an MLC capable of storing data information of a plurality of bits. Each of the cell strings 340 may be electrically coupled to a corresponding bit line among the plurality of bit lines BL0 to BLm−1. For example, as illustrated in FIG. 3, the first cell string is coupled to the first bit line BL0, and the last cell string is coupled to the last bit line BLm−1, For reference, in FIG. 3, 'DSL' denotes a drain select line, 'SSL' denotes a source select line, and 'CSL' denotes a common source line.

Although FIG. 3 illustrates NAND flash memory cells, the invention is not limited in this way. It is noted that the memory cells may be NOR flash memory cells, or hybrid flash memory cells including two or more types of memory cells combined therein. Also, it is noted that the memory device 150 may be a flash memory device including a conductive floating gate as a charge storage layer or a charge trap flash (CTF) memory device including an insulation layer as a charge storage layer.

The memory device 150 may further include a voltage supply 310 which provides word line voltages including a program voltage, a read voltage and a pass voltage to supply to the word lines according to an operation mode. The voltage generation operation of the voltage supply 310 may be controlled by a control circuit (not illustrated). Under the control of the control circuit, the voltage supply 310 may select one of the memory blocks (or sectors) of the memory cell array, select one of the word lines of the selected memory block, and provide the word line voltages to the selected word line and the unselected word lines as may be needed.

The memory device 150 may include a read and write (read/write) circuit 320 which is controlled by the control circuit. During a verification/normal read operation, the read/write circuit 320 may operate as a sense amplifier for reading data from the memory cell array. During a program operation, the read/write circuit 320 may operate as a write driver for driving bit lines according to data to be stored in the memory cell array. During a program operation, the read/write circuit 320 may receive from a buffer (not illustrated) data to be stored into the memory cell array, and apply corresponding voltages to bit lines based on the received data. The read/write circuit 320 may include a plurality of page buffers 322 to 326 respectively corresponding to columns (or bit lines) or column pairs (or bit line pairs), and each of the page buffers 322 to 326 may include a plurality of latches (not illustrated).

Figure 4A:
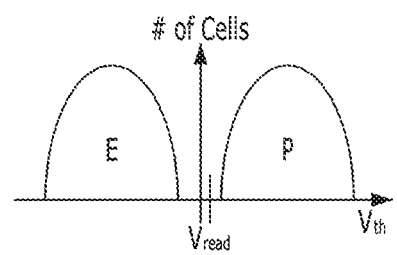
FIG. 4a and FIG. 4b are diagrams illustrating threshold voltage distributions of memory cells included in a memory device.
Figure 4B:
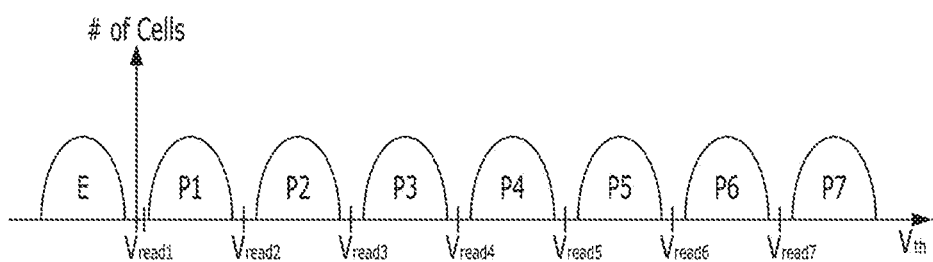

FIG. 4a and FIG. 4b are diagrams illustrating threshold voltage distributions of memory cells included in the memory device 150.

FIG. 4a is a diagram illustrating the threshold voltage distribution of memory cells programmed in the SLC mode.

In the graph of FIG. 4a, a horizontal axis denotes a threshold voltage and a vertical axis denotes the number of memory cells having a corresponding threshold voltage.

Referring to FIG. 4a, the memory cells may be programmed in the single level cell (SLC) mode to have any one of two states according to the threshold voltage distribution. In FIG. 4a, the threshold voltage distribution indicated by a solid line represents a threshold voltage distribution when the memory cells are ideally programmed.

FIG. 4b is a diagram illustrating the threshold voltage distribution of memory cells programmed in the TLC mode.

In the graph of FIG. 4b, a horizontal axis denotes a threshold voltage and a vertical axis denotes the number of memory cells having a corresponding threshold voltage.

Referring to FIG. 4b, the memory cells may be programmed in the triple level cell (TLC) mode to have any one of eight states according to the threshold voltage distribution. In FIG. 4b, the threshold voltage distribution indicated by a solid line represents a threshold voltage distribution when the memory cells are ideally programmed.

When the memory device 150 programs a memory cell in the TLC mode, since it is necessary to apply a plurality of program voltages in order to program the memory cell such that eight threshold voltage states are distinguished from one another, it may take a long time to complete a program operation.

When the memory device 150 programs a memory cell in the MLC mode, a storage capacity per same area of a memory chip may be larger than that in the case of programming the memory cell in the SLC mode. However, the time required for the program operation may be longer when programming in the MLC mode than when programming in the SLC mode.

The memory system 110 may support turbo write in order to store a large amount of data in the memory device 150 and provide performance as in the SLC mode.

FIG. 5 is a diagram for explaining a turbo write operation of the memory system 110.

The host 102, the controller 130, and the memory device 150 illustrated in FIG. 5 correspond to the host 102, the controller 130, and the memory device 150 described with reference to FIG. 1.

The host 102 may provide a turbo write request and write data to the controller 130 in order to store data in the memory system 110 at a high speed.

The controller 130 may queue the turbo write request from the host 102 in the request queue 202. The controller 130 may schedule the execution of a program command by using the address mapper 204 such that the memory device 150 write (program) the write data in the single level cell mode, and provide the scheduled program command to the memory device 150.

The memory device 150 may program the write data in the SLC mode in response to the program command of the controller 130. When the program operation of the memory device 150 is completed, the controller 130 may provide a response to the host 102. When the host 102 provides the turbo write request to the controller 130, if a program time according to the SLC mode elapses, the host 102 may receive a response from the controller 130.

The controller 130 may control the memory device 150 by using the address mapper 204 to copy write data stored in a memory block in the SLC mode and write the write data to another memory block in the MLC mode during the idle period of the memory device 150. When the memory device 150 writes the write data in the MLC mode, the write data in the SLC mode may be changed to invalid data. The write data in the SLC mode is written to another memory block in the MLC mode, so that the capacity of the write data occupied in the memory device 150 may be reduced.

The memory system 110 may configure a superblock with memory blocks allocated from a plurality of planes and individually provide program commands to the plurality of planes, in order to maximize access performance. The planes having received the program commands may perform program operations at the same time.

Figure 6:
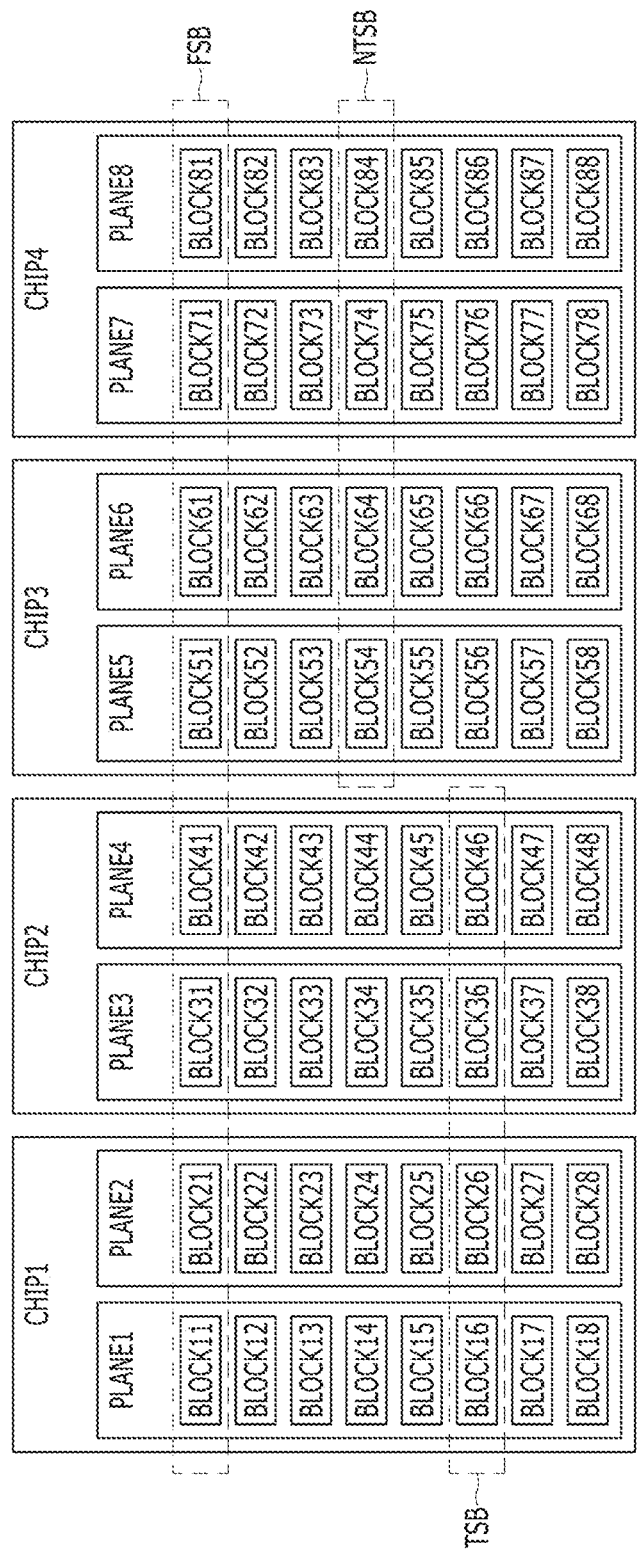
FIG. 6 is a diagram for explaining a superblock of a memory system.

FIG. 6 is a diagram for explaining a superblock of the memory system 110.

FIG. 6 illustrates a plurality of memory chips CHIP1 to CHIP4 included in the memory device 150. Each of the memory chips may include at least one plane. In the example of FIG. 6, each of the plurality of memory chips CHIP1 to CHIP4 may include two planes. That is, the memory device 150 of FIG. 6 may include eight planes PLANE1 to PLANE8. Each of the plurality of planes PLANE1 to PLANE8 may include a plurality of memory blocks. In an embodiment, each of the plurality of planes PLANE1 to PLANE8 may include an SLC memory block and an MLC memory block. In an embodiment, each of the plurality of planes PLANE1 to PLANE8 may include an MLC memory block and the MLC memory block may be selectively programmed in the SLC mode or the MLC mode. In the context of this patent application, "SLC memory block" can indicate a memory block that is configured to store one bit of data in each memory cell in that memory block, and "MLC memory block" can indicate a memory block that is configured to store more than one bit of data in each memory cell in that memory block.

One plane may perform only one operation at the same time. However, the plurality of planes PLANE1 to PLANE8 may operate in parallel. In order to improve the access performance of the memory system 110, the controller 130 may configure one superblock by logically connecting memory blocks capable of operating in parallel.

In the example of FIG. 6, the controller 130 may configure a superblock with $11^{th}$, $21^{st}$, $31^{st}$, $41^{st}$, $51^{st}$, $61^{st}$, $71^{st}$, and $81^{st}$ blocks BLOCK11, BLOCK21, BLOCK31, BLOCK41, BLOCK51, BLOCK61, BLOCK71, and BLOCK81 among the memory blocks included in the plurality of planes PLANE1 to PLANE8. The superblock configured by allocating the memory blocks from all the planes included in the memory device 150 may be referred to as a full superblock (FSB).

In a case where the memory system 110 uniformly configures superblocks as only full superblocks (FSB), when the normal write request and the turbo write request are received from the host 102 in a mixed manner, the performance of the turbo write request maybe lower than expected.

Each plane of the memory device 150 may perform only one operation at the same time. When the memory system 110 configures the superblocks as the full superblocks (FSB), the address mapper 204 may schedule the execution of a program command such that program operations are simultaneously performed in all planes regardless of the type of the write request. When the normal write requests are queued in the request queue 202 of the memory system 110 and then the turbo write request is queued, each plane of the memory device 150 may perform an operation corresponding to the turbo write request after completing an operation corresponding to the normal write requests.

In an embodiment of the disclosed technology, when the normal write request and the turbo write request are received from the host 102 in a mixed manner, the address mapper 204 may schedule a program command such that operations corresponding to the normal write request and the turbo write request are performed in separate planes.

For example, the controller 130 may configure a turbo superblock (TSB) by logically connecting memory blocks allocated from the first to fourth planes PLANE1 to PLANE4. The address mapper 204 may control the memory device 150 such that a program operation is performed on the memory blocks constituting the turbo superblock (TSB) in the SLC mode. In an implementation, the memory blocks constituting the turbo superblock may be SLC memory blocks.

The controller 130 may configure a non-turbo superblock (NTSB) by logically connecting memory blocks allocated from the fifth to eighth planes PLANE5 to PLANE8 capable of operating independently of the first to fourth planes PLANE1 to PLANE4. The address mapper 204 may control the memory device 150 such that a program operation is performed on the memory blocks constituting the non-turbo superblock (NTSB) in the MLC mode. However, the present embodiment is not limited thereto and the address mapper 204 may change the cell mode of the non-turbo superblock (NTSB) according to the attribute of the write data provided with the normal write request.

FIG. 6 illustrates a turbo superblock (TSB) including $16^{th}$, $26^{th}$, $36^{th}$, and $46^{th}$ blocks BLOCK 16, BLOCK 26, BLOCK 36, and BLOCK 46 and a non-turbo superblock (NTSB) including $54^{th}$, $64^{th}$, $74^{th}$, and $84^{th}$ blocks BLOCK54, BLOCK64, BLOCK74, and BLOCK84.

The address mapper 204 may schedule the execution of a program command such that write data corresponding to the turbo write request is stored in the turbo superblock (TSB). When the normal write request is received by being mixed with the turbo write request, the address mapper 204 may schedule the execution of a program command such that write data corresponding to the normal write request is stored in the non-turbo superblock (NTSB).

The address mapper 204 may schedule the execution of a program command such that an operation corresponding to the turbo write request and an operation corresponding to the normal write request are performed in different planes by using the turbo superblock (TSB) and the non-turbo superblock (NTSB).

In an embodiment, when only the normal write request is received from the host 102, the address mapper 204 may schedule the execution of a program command such that write data corresponding to the normal write request is stored in the full superblock (FSB). In an embodiment, the address mapper 204 may control the memory device 150 such that the write data is programmed in the full superblock (FSB) in the MLC mode. However, the present embodiment is not limited thereto and the address mapper 204 may change the cell mode of the full superblock (FSB) according to the attribute of the write data.

Figure 7:
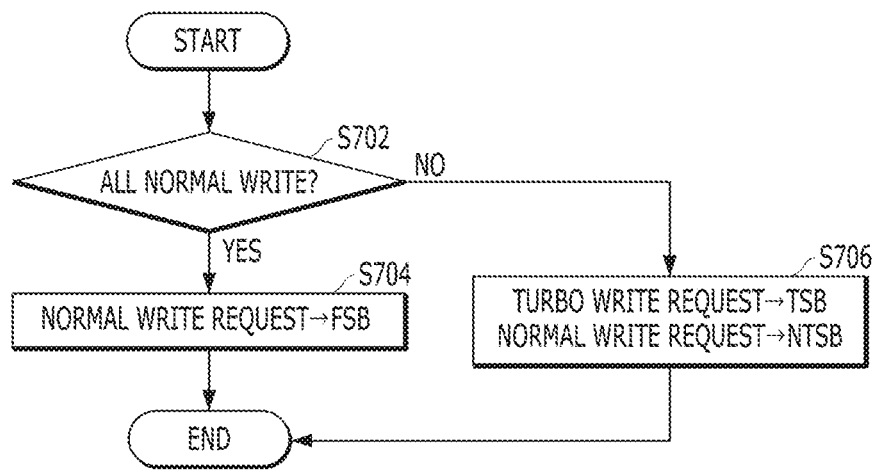
FIG. 7 is a diagram illustrating an operation of a memory system based on an embodiment of the disclosed technology.

FIG. 7 is a diagram illustrating an operation of the memory system 110 based on an embodiment of the disclosed technology.

The address mapper 204 may perform step S702 whenever commands corresponding to write requests are to be scheduled in the request queue 202.

In step S702, the address mapper 204 may determine whether the write requests queued in the request queue 202 are all normal write requests.

In an embodiment, based on flag information included in the received write requests, the address mapper 204 may determine whether the write requests are turbo write requests. Depending on whether the host 102 provides the turbo write request or the normal write request to the controller 130, the flag information may indicate whether the write request provided by the host 102 is the turbo write request or the normal write request.

When the write requests queued in the request queue 202 are all the normal write requests ("YES" in step S702), the address mapper 204 may schedule the execution of a program command such that write data corresponding to the normal write request is stored in the full superblock (FSB), in step S704. The memory interface 136 may control the memory device 150 in response to the program command.

When there is at least one turbo write request among the write requests queued in the request queue 202 ("NO" in step S702), the address mapper 204 may schedule the execution of a program command such that program operations corresponding to the normal write request and the turbo write request are performed in different planes, in step S704. The memory interface 136 may control the memory device 150 in response to the program command.

For example, when a request queued first in the request queue 202 is the normal write request, the address mapper 204 may schedule the execution of a program command such that write data corresponding to the request is stored in the non-turbo superblock (NTSB). The address mapper 204 may schedule the execution of a program command such that write data corresponding to a turbo write request queued after the normal write request is stored in the turbo superblock (TSB) without waiting for the completion of the normal write request.

When at least one turbo write request is queued in the request queue 202, the address mapper 204 may schedule the execution of a program command in an interleaving manner such that program operations corresponding to the normal write request and the turbo write request queued in the request queue 202 are performed in different planes. When a turbo write request is queued in the request queue 202, the address mapper 204 may quickly provide the host 102 with a response for the turbo write request.

Figure 8A:
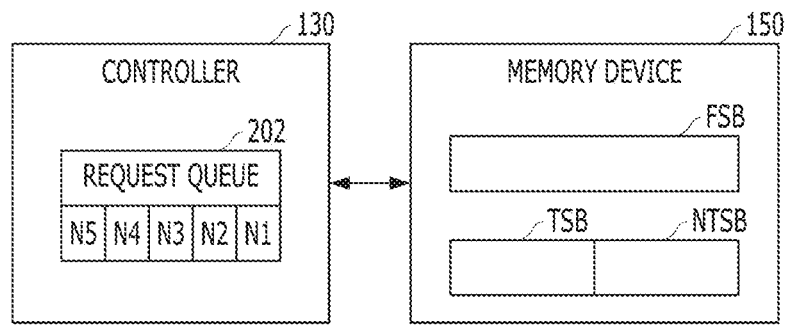
FIG. 8a to FIG. 8c are diagrams for explaining an operation of a memory system based on an embodiment of the disclosed technology.
Figure 8B:
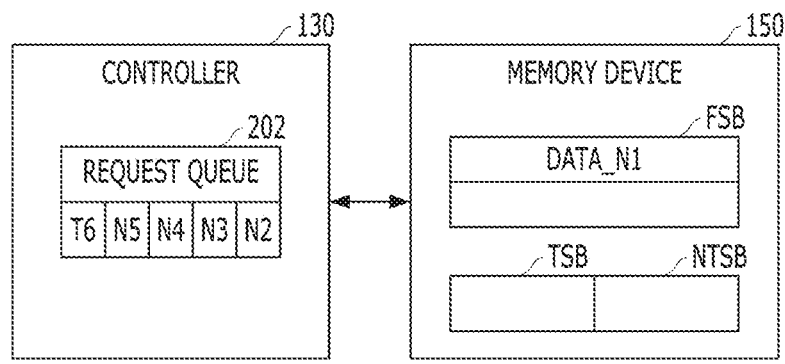
Figure 8C:
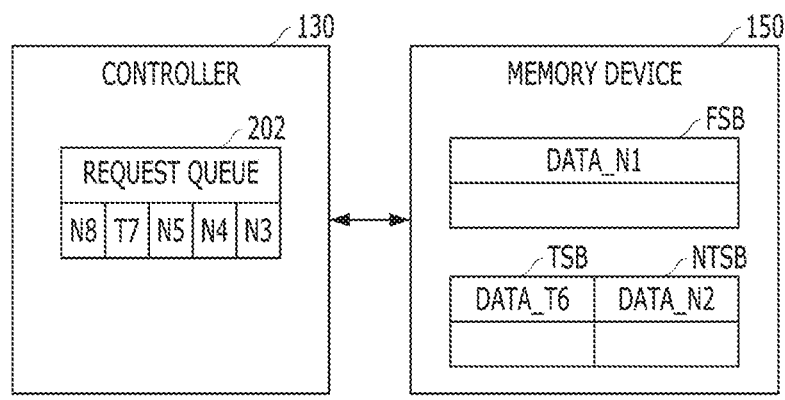

FIG. 8a to FIG. 8c are diagrams for explaining an operation of the memory system 110 based on an embodiment of the disclosed technology.

The controller 130 and the memory device 150 illustrated in FIG. 8a to FIG. 8c correspond to the controller 130 and the memory device 150 described with reference to FIG. 1. FIG. 8a to FIG. 8e illustrate the request queue 202 included in the controller 130 and open memory blocks of the memory device 150, and the other components that may be included in the controller 130 and the memory device 150 are omitted. The memory device 150 may include a full superblock (FSB), a turbo superblock (TSB), and a non-turbo superblock (NTSB) as the open memory blocks.

The turbo superblock (TSB) may include memory blocks allocated from all planes of a first plane group among the planes of the memory device 150. In an implementation, the first plane group may include an SLC memory block. The non-turbo superblock (NTSB) may include memory blocks allocated from all planes of a second plane group among the planes of the memory device 150. The second plane group is a group of planes which do not belong to the first plane group. The full superblock (FSB) may include memory blocks allocated from a third plane group of the memory device 150. The third plane group may include all planes included in the memory device 150.

In the example of FIG. 8a, it is assumed that first to fifth normal write requests N1 to N5 are sequentially received from the host 102. The request queue 202 may queue the first to fifth normal write requests N1 to N5. Read requests that may be queued in the request queue 202 are omitted. The address mapper 204 may determine whether all the write requests queued in the request queue 202 are the normal write requests, in order to schedule the execution of a program command corresponding to the first normal write request N1.

Referring to FIG. 8a, all the write requests queued in the request queue 202 may be the normal write requests. The address mapper 204 may schedule the execution of a program command such that first write data corresponding to the first normal write request N1 is stored in the full superblock (FSB). The address mapper 204 may schedule the execution of the program command such that the first write data is stored in an interleaving manner in memory blocks constituting the full superblock (FSB). The address mapper 204 may individually provide the program command to all memory chips of the memory device 150 through the memory interface 136.

In the example of FIG. 8b, it is assumed that a sixth turbo write request T6 is received from the host 102 after the execution of the first normal write request N1 is completed. First write data DATA_N1 may be stored in the full superblock (FSB) in an open block state. The request queue 202 may queue the second to fifth normal write requests N2 to N5 and the sixth turbo write request T6.

The address mapper 204 may determine whether all the write requests queued in the request queue 202 are the normal write requests, in order to schedule the execution of a program command corresponding to the second normal write request N2.

Referring to FIG. 8b, since the sixth turbo write request T6 has been queued in the request queue 202, all the write requests queued in the request queue 202 are not the normal write requests. The address mapper 204 may schedule the execution of a program command such that second write data corresponding to the second normal write request N2 is stored in the non-turbo superblock (NTSB). The address mapper 204 may schedule the execution of the program command such that the second write data is stored in an interleaving manner in memory blocks constituting the non-turbo superblock (NTSB). The address mapper 204 may provide the program command to the second plane group.

In order to maximize the program performance of the memory device 150, the address mapper 204 may schedule the execution of the program command such that sixth write data corresponding to the sixth turbo write request T6 is stored in the turbo superblock (TSB). The address mapper 204 may schedule the execution of the program command such that the sixth write data is stored in an interleaving manner in memory blocks constituting the turbo superblock (TSB). The address mapper 204 may provide the program command to the first plane group such that the sixth write data is programmed in the SLC mode.

The address mapper 204 may provide the program command to the first plane group such that the sixth write data is programmed in the SLC mode without waiting for the completion of the programming of the second write data. The memory device 150 may program the sixth write data simultaneously with the programming of the second write data.

In the example of FIG. 8c, it is assumed that the execution of the second normal write request N2 and the sixth turbo write request T6 is completed and a seventh turbo write request T7 and an eighth normal write request N8 are received from the host 102. FIG. 8c illustrates a state in which the sixth write data has been stored in the turbo superblock (TSB) and the second write data has been stored in the non-turbo superblock (NTSB).

When the address mapper 204 intends to schedule the execution of a program command corresponding to a third normal write request N3, the request queue 202 may queue both the normal write request and the turbo write request. The address mapper 204 may schedule the execution of a program command such that third write data corresponding to the third normal write request N3 is stored in the non-turbo superblock (NTSB). The address mapper 204 may schedule the execution of a program command such that seventh write data corresponding to the seventh turbo write request T7 is stored in the turbo superblock (TSB).

When the program operation of the sixth write data performed in the first plane group is completed, the memory device 150 may perform the program operation of the seventh write data as long as there is no read request to be first performed in the first plane group. However, the memory device 150 may perform the program operation of the seventh write data without waiting for the completion of the program operation corresponding to the third to fifth normal write requests N3 to N5 queued before the seventh turbo write request T7.

Meanwhile, until a response corresponding to a request for a certain logical address is received from the memory system 110, the host 102 may not provide the request for the logical address to the memory system 110 again. Accordingly, even though a turbo write request queued after a normal write request is performed earlier than the normal write request queued before the turbo write request, the memory system 110 may not refer to an erroneous memory area in correspondence to the logical address.

The processor 134 may load the sixth and seventh write data stored in the turbo superblock (TSB) to the memory 138 during an idle time, and program the data in the memory device 150 in the MLC mode.

In an embodiment of the disclosed technology, the memory system 110 may schedule the execution of a program command such that the turbo write request and the normal write request are performed in separate planes. The memory system 110 may configure the turbo superblock (TSB) and the non-turbo superblock (NTSB) such that the turbo write request and the normal write request may be performed in different planes.

The turbo superblock (TSB) may include the memory blocks of the first plane group. The memory blocks constituting the turbo superblock (TSB) may be accessed in the SLC mode. The non-turbo superblock (NTSB) may include the memory blocks of the second plane group. In some implementations, the memory blocks constituting the non-turbo superblock (NTSB) may be accessed in the MLC mode.

In an embodiment of the disclosed technology, when the turbo write request and the normal write request are mixed, the memory system 110 may complete the turbo write request without waiting for the completion of the normal write request queued before the turbo write request. The memory system 110 may complete the turbo write request at a high speed without being limited to a processing speed of the normal write request received before the turbo write request. Accordingly, the memory system 110 may provide a quick response for the turbo write request to meet the demand of the host 102.

In an embodiment of the disclosed technology, when there is no turbo write request to be performed, the memory system 110 may configure the full superblock (FSB) such that the normal write request is performed at maximum performance. The full superblock (FSB) may include the memory blocks of the third plane group including the first and second plane groups.

Although various embodiments have been described for illustrative purposes, it will be apparent to those skilled in the art that various changes and modifications may be made without departing from the spirit and scope of the invention as defined in the following claims.

What is claimed is:

1. A controller configured to control memory chips in communication with the controller, each of the memory chips including at least one plane, each plane including a plurality of memory blocks, the controller comprising:
   a host interface configured to receive a request from a host;
   an address mapper configured to, upon receipt of both a turbo write request for writing data to one or more high-speed storage blocks at a high speed to and a normal write request for writing data to one or more storage blocks at a lower speed, allocate, among the at least one plane of each of the memory chips, a first plane including a memory block configured to perform write operations in a single level cell mode at the high speed to a first plane group in order to respond to the turbo write request, and allocate a second plane to a second plane group at the slower speed in order to respond to the normal write request; and a memory interface configured to control the memory chips such that the first plane group performs an operation corresponding to the turbo write request and the second plane group performs an operation corresponding to the normal write request, p1 wherein, upon receiving the normal write request only without the turbo write request, the address mapper allocates the first plane and the second plane to a third plane group, and the memory interface controls the memory chips such that the third plane group performs an operation corresponding to the normal write request.

2. The controller of claim 1, wherein the operation corresponding to the turbo write request includes writing data corresponding to the turbo write request to the first plane group in the single level cell mode.

3. The controller of claim 2, wherein the operation corresponding to the turbo write request further writing the data of a memory block in the single level cell mode to another memory block in a multi-level cell mode during an idle period of the first and second planes.

4. The controller of claim 1, wherein the operation corresponding to the normal write request includes writing data corresponding to the normal write request to the second plane group in a multi-level cell mode.

5. The controller of claim 1, wherein the address mapper configures a turbo superblock with memory blocks allocated from each first plane and performs mapping between a logical address corresponding to the turbo write request and a physical address of the turbo superblock such that data is stored in the turbo superblock in an interleaving manner.

6. The controller of claim 1, wherein the address mapper configures a non-turbo superblock with memory blocks allocated from each second plane and performs mapping between a logical address corresponding to the normal write request and a physical address of the non-turbo superblock such that data is stored in the non-turbo superblock in an interleaving manner.

7. The controller of claim 1, wherein the memory interface configures a full superblock with memory blocks allocated from each first plane and each second plane and performs mapping between a logical address corresponding to the normal write request and a physical address of the full superblock such that data is stored in the full superblock in an interleaving manner.

8. The controller of claim 7, wherein the memory interface schedules an execution of a program command such that each first plane and each second plane perform program operations in parallel.

9. The controller of claim 1, wherein the memory interface controls each first plane and each second plane to perform program operations in a multi-level cell mode in response to a program command corresponding to the normal write request.

10. An operation method of a controller configured to control a plurality of memory chips in communication with the controller, each of the memory chips including at least one plane, each plane including a plurality of memory blocks, the operation method comprising:

receiving a request from a host;

upon receipt of both a turbo write request and a normal write request, allocating, among the at least one plane of each of the memory chips, a first plane including a memory block configured to perform write operations in a single level cell mode to a first plane group, and allocating a second plane to a second plane group, the first plane being different from the second plane; p1 controlling the memory chips such that the first plane group performs an operation corresponding to the turbo write request and the second plane group performs an operation corresponding to the normal write request; and upon receiving the normal write request only without the turbo write request, allocating the first plane and the second plane to a third plane group, and controlling the memory chips such that the third plane group performs an operation corresponding to the normal write request.

11. The operation method of claim 10, wherein controlling the memory chips such that the first plane group performs an operation corresponding to the turbo write request comprises:

controlling the first plane group to write data corresponding to the turbo write request in a single level cell mode.

12. The operation method of claim 11, wherein controlling the memory chips such that the first plane group performs an operation corresponding to the turbo write request further comprises:

controlling the memory chips to write the data written a memory block in the single level cell mode to another memory block in a multi-level cell mode during an idle period of the first and second planes.

13. The operation method of claim 10, wherein controlling the memory chips such that the second plane group performs an operation corresponding to the normal write request comprises:

controlling the second plane group to program data corresponding to the normal write request in a multi-level cell mode.

14. The operation method of claim 10, wherein controlling the memory chips such that the first plane group performs an operation corresponding to the turbo write request comprises:

configuring a turbo superblock with memory blocks allocated from each first plane; and performing mapping between a logical address corresponding to the turbo write request and a physical address of the turbo superblock such that data is stored in the turbo superblock in an interleaving manner.

15. The operation method of claim 10, wherein controlling the memory chips such that the second plane group performs an operation corresponding to the normal write request comprises:

configuring a non-turbo superblock with memory blocks allocated from each second plane; and performing mapping between a logical address corresponding to the normal write request and a physical address of the non-turbo superblock.

16. The operation method of claim 10, wherein controlling the memory chips such that the third plane group performs an operation corresponding to the normal write request comprises:

configuring a full superblock with memory blocks allocated from each first plane and each second plane; and performing mapping between a logical address corresponding to the normal write request and a physical address of the full superblock such that data is stored in the full superblock in an interleaving manner.

17. The operation method of claim 16, further comprising:

scheduling an execution of a program command such that each first plane and each second plane perform program operations in parallel.

18. The operation method of claim 10, wherein controlling the memory chips such that the third plane group performs an operation corresponding to the normal write request comprises:
    controlling each first plane and each second plane to perform program operations in a multi-level cell mode in response to a program command corresponding to the normal write request.

\* \* \* \* \*